United States Patent
Gellrich

(10) Patent No.: US 9,603,256 B2
(45) Date of Patent: Mar. 21, 2017

(54) PROCESS FOR PRODUCING ARTICLES HAVING AN ELECTRICALLY CONDUCTIVE COATING

(75) Inventor: Andreas Gellrich, Bechtheim (DE)

(73) Assignee: A.M. Ramp & Co. GMBH (DE)

( * ) Notice: Subject to any disclaimer, the term of this patent is extended or adjusted under 35 U.S.C. 154(b) by 1600 days.

(21) Appl. No.: 12/064,769

(22) PCT Filed: May 15, 2006

(86) PCT No.: PCT/EP2006/004572
§ 371 (c)(1),
(2), (4) Date: Jun. 17, 2008

(87) PCT Pub. No.: WO2007/022810
PCT Pub. Date: Mar. 1, 2007

(65) Prior Publication Data
US 2008/0246007 A1 Oct. 9, 2008

(30) Foreign Application Priority Data

Aug. 24, 2005 (EP) ..................................... 05018399

(51) Int. Cl.
| | |
|---|---|
| *H01B 1/20* | (2006.01) |
| *H05K 3/12* | (2006.01) |
| *B05D 3/02* | (2006.01) |
| *B05D 5/12* | (2006.01) |
| *B05D 7/04* | (2006.01) |
| *B05D 3/12* | (2006.01) |
| *H05K 1/09* | (2006.01) |

(52) U.S. Cl.
CPC ............. *H05K 3/12* (2013.01); *B05D 3/0254* (2013.01); *B05D 5/12* (2013.01); *B05D 7/04* (2013.01); *H01B 1/20* (2013.01); *B05D 3/12* (2013.01); *B05D 2601/28* (2013.01); *H05K 1/095* (2013.01); *H05K 2203/0143* (2013.01); *H05K 2203/0278* (2013.01); *H05K 2203/0786* (2013.01)

(58) Field of Classification Search
CPC ....................................................... H01B 1/20
See application file for complete search history.

(56) References Cited

U.S. PATENT DOCUMENTS

| | | | | |
|---|---|---|---|---|
| 3,643,756 A | * | 2/1972 | Soreghy | 180/271 |
| 3,779,878 A | * | 12/1973 | Swift et al. | 205/149 |
| 4,522,888 A | * | 6/1985 | Eichelberger et al. | 428/546 |
| 4,921,755 A | | 5/1990 | Carroll, Jr. et al. | |
| 5,286,415 A | * | 2/1994 | Buckley | A61N 1/0496 106/1.18 |
| 5,928,571 A | * | 7/1999 | Chan | 252/514 |
| 5,973,598 A | * | 10/1999 | Beigel | 340/572.1 |
| 6,007,758 A | * | 12/1999 | Fleming et al. | 264/429 |
| 2002/0033340 A1 | * | 3/2002 | Cheung et al. | 205/101 |
| 2002/0195194 A1 | * | 12/2002 | Grabau et al. | 156/300 |
| 2003/0066756 A1 | * | 4/2003 | Gabe et al. | 205/296 |
| 2003/0151028 A1 | * | 8/2003 | Lawrence et al. | 252/500 |
| 2004/0101624 A1 | * | 5/2004 | Bayes | C23C 22/52 427/337 |
| 2004/0178391 A1 | * | 9/2004 | Conaghan et al. | 252/500 |
| 2007/0239245 A1 | * | 10/2007 | Borgaonkar et al. | 607/121 |

FOREIGN PATENT DOCUMENTS

| | | |
|---|---|---|
| DE | 2114934 | 10/1972 |
| GB | 1268100 | 3/1972 |
| GB | 1589390 | 5/1981 |
| WO | WO 98/37133 | 8/1998 |
| WO | WO 03/003381 | 1/2003 |
| WO | WO 2004/048463 | 6/2004 |

OTHER PUBLICATIONS

Ansuini et al., Factors Affecting the Accuracy of Reference Electrodes, Materials Performance, vol. 33, No. 11, 1994, pp. 1-4.*
Patent Cooperation Treaty, International Search Report & Written Opinion of the International Search Authority, PCT/EP06/004572, Aug. 29, 2006, 13 pages.

* cited by examiner

*Primary Examiner* — Francisco Tschen
(74) *Attorney, Agent, or Firm* — Viksnins Harris & Padys PLLP

(57) ABSTRACT

The present invention relates to a process for producing articles having on at least part of their surface an electrically conductive coating by at least partly coating a substrate with a composition comprising finely divided electrically conductive metal particles and a binder and subjecting the coated substrate to at least one treatment with water in the presence of a halide ion source at a temperature in the range from ambient temperature to 200° C. The process of the invention allows articles having an electrically conductive coating to be produced in a simple, rapid and mild way.

11 Claims, No Drawings

PROCESS FOR PRODUCING ARTICLES HAVING AN ELECTRICALLY CONDUCTIVE COATING

The present invention relates to a process for producing articles having on at least part of their surface an electrically conductive coating.

Articles with electrically conductive coatings find diverse application, for example as conductor tracks, shields against electromagnetic fields, RFID antennas, etc. These articles are produced by conventionally coating a substrate with an electrically conductive composition, such as by a printing, painting, spraying or spreading method. The electrically conductive compositions are normally composed of a high weight fraction of electrically conductive substances in particle form, such as silver, copper or carbon particles or mixtures thereof, which have been taken up in a liquid or pasty polymer matrix. After the composition has been applied the coating is dried and/or cured. The degree of conductivity of the coating depends on how effectively electrical contact can be produced between the conductive particles. A variety of methods are employed for this purpose.

One method is the so-called thick-film technique, which is employed in particular for producing hybrid circuits on ceramic substrates. In that case paste-like compositions comprising organic binders and solvents, in which the conductive material has been dispersed and which comprise further constituents if desired, are applied in the form of the desired pattern and dried. Subsequent firing at temperatures of >350° C. bakes the organic material and causes the conductive material to sinter to form conductor tracks. In view of the high temperatures, the application of this technique is limited to ceramic substrates. The attainable conductivities are typically half to a quarter of the conductivity of the corresponding solid metal.

Another method is the thin-film technique, in which metals are vaporized under a high vacuum and deposited in the desired pattern on a substrate. The films obtained in this case are substantially thinner than with the thick-film technique; the film thickness is generally about 0.1 µm. In this case it is frequently necessary to reinforce the film thickness, by means of electroplating, to 3 µm. The thin-film technique is expensive and is therefore employed rarely.

A further method is described in WO 98/37133 and WO 03/003381. In this case a composition comprising a reactive organic medium and a metal powder is applied to a substrate and heated to temperatures of up to 450° C., during which the desired conductor tracks are formed. The reactive organic medium is an organometallic compound, such as a metal salt of an organic acid, for example the silver salt of neodecanoic acid or 2-ethylhexanoic acid. Under the temperatures employed, the organometallic compound undergoes decomposition to form the corresponding metal, which attaches to the metal particles present in the composition. Owing to the high temperatures, this method too is subject to restrictions in terms of substrates that can be used.

A further method involves using systems based on thermoplastic or thermosetting binders with solvents. The metal particles are present in the binder matrix. In order thereby to attain standardized specific surface conductivities of the order of at least 25 mΩ/25 µm (25 mΩ/sq. mil) for silver particles, these systems must be fully cured or dried. In that case it is generally necessary to employ temperatures of >100° C. for a number of minutes.

Common features of the methods of the prior art are that they require application of high temperatures for a relatively long time and/or produce coatings having an undesirably low conductivity, thereby necessitating additional measures to improve the conductivity.

The object on which the present invention is based, therefore, is that of providing a process for producing articles having an electrically conductive coating that can be carried out rapidly and simply at a low temperature and yet produces coatings having a high electrical conductivity.

Surprisingly it has now been found that this object is achieved if a composition comprising electrically conductive metal particles is applied to a substrate and the coated substrate is subjected to treatment with water in the presence of a halide ion source.

The present invention accordingly provides a process for producing articles having on at least part of their surface an electrically conductive coating which comprises at least partly coating a substrate with a composition comprising finely divided electrically conductive metal particles and a binder and subjecting the coated substrate to at least one treatment with water in the presence of a halide ion source at a temperature in the range from ambient temperature to 200° C.

Electrical conductivity for the purposes of the invention is present when the standardized specific surface resistance is less than 100 mΩ/25 µm, in particular less than 50 mΩ/25 µm, preferably less than 25 mΩ/25 µm, with particular preference less than 10 mΩ/25 µm.

The process of the invention employs a composition comprising electrically conductive metal particles. Preferred electrically conductive metals are copper, silver, gold, zinc, cadmium, iron, cobalt, nickel, ruthenium, rhodium, palladium, osmium, iridium, platinum, manganese, rhenium, vanadium, niobium, tantalum, chromium, molybdenum, tungsten, titanium, aluminium, indium, tin, lead, antimony or bismuth and also mixtures and alloys thereof. Particularly preferred metals are silver, copper, aluminium or mixtures and alloys thereof. The metal particles can be employed in any desired morphology, although it is preferred to use flakes or spheres. Preferred flakes have an average main diameter in the range from 0.1 µm to 100 µm, preferably 2 µm to 50 µm and in particular 5 µm to 30 µm. The average thickness of the flakes is preferably in the range from 0.05 µm to 2 µm, preferably 0.1 µm to 1 µm. The ratio of main diameter to thickness in the flakes is in the range from 2:1 to 2000:1. Preferred spheres have an average diameter in the range from 1 nm to 100 µm, preferably 10 nm to 10 µm and in particular 10 or 20 nm to 1 µm.

The composition typically comprises a binder. This may be an organic polymeric binder or a component, which can be cured by means of appropriate measures. Examples of suitable polymeric binders are thermoplastic polymers such as polyvinyl butyrals (Copolymers composed of butyl acetal units, methyl acrylate units and vinyl alcohol units), poly(meth)acrylate-based polymers such as straight (meth)acrylates or copolymers thereof with, for example, styrene, butadiene, etc., polyvinyl chloride-based polymers, polyamide-based polymers, cellulose ethers or cellulose esters. Also suitable, however, are thermosetting polymers, such as epoxy resins, polyester resins, polyurethane resins, highly crosslinked acrylate resins and alkyd resins.

Curable components are, in particular, reactive resins, reactive varnishes and reactive diluents. Components of this kind are, in particular, radiation-curable resins, examples being monomeric, oligomeric or polymeric (meth)acrylic esters containing polymerizable vinyl groups, and also polyurethanes prepared from polyisocyanates and polyols (polyether polyols, polyester polyols). When curable components are used the auxiliaries required for curing are also present, such as UV initiators, accelerants, etc.

In addition to these the composition may further comprise solvents. Particularly useful solvents are water; esters, such as alkyl acetates, for example methyl, ethyl, propyl, butyl and isobutyl acetates, alkyl glycol acetates, such as methyl glycol acetate, butyl glycol acetate, methoxypropyl acetate, butoxymethyl acetate; alcohols, such as methanol, ethanol, n-propanol, isopropanol, n-octanol, isobutanol, glycol or glycerol, ketones, such as acetone, methyl ethyl ketone, methyl isobutyl ketone, cyclohexanon or isophoron; ethers, such as dioxane or tetrahydrofuran; or glycol ethers, such as methyl glycol, ethyl glycol, butyl glycol, 3-methoxybutan-1-ol or 1-methoxypropan-2-ol, polyethylene glycols or mixtures thereof.

In addition the composition may comprise typical adjuvents, examples being surfactants, dyes, pigments, fillers, etc.

The amount of metal particles in the composition is generally in the range from 60% to 99% by weight, preferably 70% to 99% by weight and in particular 80% to 99% by weight, based on the total weight of electrically conductive metal particles and binder. The amount of binder is then generally in the range from 1% to 40% by weight, preferably 1% to 30% by weight and in particular 1% to 20% by weight, based on the total weight of electrically conductive metal particles and binder. The weight ratio of binder to electrically conductive metal particles is generally in the range from 1:99 to 40:60, preferably 1:99 to 30:70 and in particular 1:99 to 20:80. The amount of solvent is generally selected such that the composition has a viscosity suitable for application to the substrate. Frequently the amount of solvents is then in the range from 5% to 50% by weight, preferably 10% to 40% by weight and in particular 15% to 35% by weight, based on the total weight of a composition.

The composition can be applied to the substrate by conventional methods. Suitable methods are printing, painting, spraying and spreading methods. Preference is given to printing methods, examples being screen printing, gravure printing, flexographic printing, planographic printing, pad printing and digital printing, especially ink-jet printing and transfer printing. Techniques of this kind are known to the skilled person. Preferred printing methods are screen printing, ink-jet printing and gravure printing. Application to the substrate takes place generally such as to give a dry film thickness in the range from 0.01 to 100 µm, preferably 0.1 to 50 µm.

The selection of the substrates which can be used in the process of the invention is limited in terms neither of the material nor of the form of the substrates. They may be rigid or flexible and of plastic, metal, ceramic or paper, or may take the form of composite materials. It is preferred, however, to use the materials that are typically employed for electronic components, especially polymeric films.

Application may be followed if desired by a drying operation and/or a curing operation. The coated substrates can be dried in conventional fashion, such as in air at ambient temperature or in a drying apparatus, where appropriate under reduced pressure. Curing can be accomplished under typical conditions, such as by exposure to UV light.

To improve the conductivity the coated substrates are then subjected to treatment with water in the presence of a halide ion source (the expression "water" below denotes water comprising a halide ion source and further adjuvents where appropriate). The halide ion source used is preferably a fluoride or bromide ion source and in particular a chloride ion source. The water may also comprise adjuvents, such as surfactants, wetting agents, thickeners, water-miscible solvents, examples being alcohols, such as methanol, ethanol, n-propanol, isopropanol, glycol or glycerol, ketones such as acetone or methyl ethyl ketone, ethers such as dioxane or tetrahydrofuran, glycol ethers such as methyl glycol, ethyl glycol, or polyethylene glycols. The treatment is carried out preferably at a temperature in the range from ambient temperature (e.g. 15 to 30° C., in particular about 20° C.) to 200° C., in particular 20° C. up to the boiling temperature of the water, and with particular preference 50 to 95° C. Treatment with water is accomplished by contacting the coated substrate with water at the selected treatment temperature. This is appropriately effected by immersing the coated substrate in water or spraying the substrate with water. The water may already be at the desired temperature or may be brought to the desired temperature after immersion or spraying. Alternatively the treatment may also take place with steam—for example, in a chamber saturated with steam. Treatment for a short period of time is sufficient. Appropriately the period of treatment is situated in the range from 0.1 second to 10 minutes, in particular 1 second to 1 minute and with particular preference 1 second to 30 seconds. The treatment time is guided by factors which include the treatment temperature; in other words, the higher the treatment temperature, the shorter the treatment time can be.

Both organic and inorganic halides can be used as the halide ion source. The inorganic halides include, in particular, water-soluble metal halides, preference being given to alkali metal halides, alkaline earth metal halides, and also metal halides, such as Lewis acid halides, whose aqueous solution has an acidic pH. The expression "water-soluble" here denotes that the solubility in water is at least sufficient to attain the concentration indicated below for the halide ion source in solution in water. Examples of halides which can be used include lithium chloride, sodium chloride, potassium chloride, magnesium chloride, calcium chloride, aluminium chloride, zinc chloride or ammonium chloride and also the corresponding fluorides and bromides. Particularly suitable organic halides are ammonium halides, such as tetraalkylammonium halides, for example tetramethylammonium chloride or tetrahydroxyalklylammonium halides. Further suitable halide ion sources include hydrohalic acids (hydrogen halides), especially HF, HBr and, with particular preference, HCl. The hydrohalic acids are particularly suitable when the coated substrates are treated with steam.

The treatment can be appropriately performed using water which has an acidic pH, in particular a pH of 1 to 6 and with particular preference a pH of 2 to 5. The pH can be set using typical water-soluble organic or inorganic acids, such as sulphuric acid, phosphoric acid, acetic acid, etc., or by using a halide ion source whose aqueous solution has an acidic pH. Halide ion sources of this kind are the aforementioned Lewis acid halides and also hydrohalic acids.

The concentration of the halide ion source in solution in water is generally in the range from 0.01% to 10% by weight, in particular 0.1% to 7% by weight, based on the amount of water. When using acidic halides or hydrohalic acids the concentration is appropriately selected such that the solution has the desired pH.

Generally it is enough to provide one treatment with water. If desired, the treatment can be repeated one or more times.

The conductivity of the electrically conductive coating may additionally be improved by aftertreatment by rolling at a temperature of ≤200° C. Rolling takes place with typical apparatus, for example a calendar or a laminator. The pressure employed when rolling is guided by the roll temperature and by the speed at which the articles pass through the roll apparatus, and also by the roll diameter. For a roll diameter of 100 mm the pressure is generally situated in the range from 5 to 100 bar for sheets to be rolled that have a width of 50 mm.

It has proved to be particularly advantageous to perform a first rolling operation at ambient temperature (15 to 30° C.) and subsequently at least one further rolling operation at a temperature in the range from 70 to 200° C.

The coated articles may additionally be provided with a protective coat or topcoat, such as a varnish coat or a film.

The process of the invention allows the production of articles having an electrically conductive coating in a simple, rapid and cost-effective way, the electrical conductivity of the articles being at least comparable with that of articles obtained in accordance with the prior art. The process of the invention is therefore particularly suitable for producing electronic components, such as printed circuits, devices for electromagnetic shielding, RFID antennas, sensors, batteries or solar cells.

The examples which follow illustrate the invention without limitation thereof.

Example 1

A conductive screen-printing ink is prepared by stirring together 4 parts by weight of a polyvinyl butyral resin (Pioloform BL18; Wacker), 28 parts by weight of butyl glycol acetate and 68 parts by weight of silver flakes (SF9AL from Ferro) and subsequently homogenizing the mixture on a triple-roll mill. The desired screen-printing viscosity is set by addition of ethoxypropyl acetate.

A semi-automatic screen-printing apparatus is used with a screen (120-31) to print RFID antennas for UHF applications in a film thickness of 4 μm on a polyimide film 50 μm thick. After they have been dried at room temperature, these antennas have a specific surface resistance of 400 to 600 mΩ, corresponding to a standardized specific surface resistance of 64 to 96 mΩ/25 μm. Subsequently the antennas are treated for 10 seconds by immersion in an aqueous aluminium chloride solution (10 g of aluminium chloride in 200 ml of water) which has been heated to 90° C.

One batch of the samples is then subjected to aftertreatment by cold-rolling between two steel rolls with a pressure of 30 bar and also three-fold hot-rolling (calendering) in a laminator (Pouchman 12 from IBICO Trading GmbH). The figures for the standardized specific surface resistance are compiled in the table below.

| Treatment | Standardized specific surface resistance [mΩ/25 μm] |
| --- | --- |
| none | 64-96 |
| water + AlCl$_3$ | 5-7 |
| water + AlCl$_3$ + rolling | 2.6-3.0 |

Example 2

A conductive gravure ink is prepared by stirring together 4 parts by weight of a polyvinyl butyral resin (Pioloform BL18, Wacker), 26 parts by weight of ethanol, 2 parts by weight of ethoxypropyl acetate and 68 parts by weight of silver flakes (SF9AL, Ferro). The desired gravure-printing viscosity is set by addition of ethanol.

Printing is carried out using a test cylinder with 40-line engraving, hexagonal cell shape, 70 μm depth and 60° angle. Lines 2 mm wide are printed on a polyimide film (of thickness 50 μm). The printed thickness is approximately 3 μm and the lines are inhomogeneous in structure. The specific surface resistance is 180 mΩ and the standardized specific surface resistance is 21.6 mΩ/25 μm. Subsequently the printed specimens are immersed for 10 seconds in a solution of 10 g of aluminium chloride in 200 ml of water that has been heated to 90° C. The standardized specific surface resistance falls to a figure of 5.4 mΩ/25 μm.

After treatment by rolling as specified in Example 1 causes the standardized specific surface resistance to fall to a figure of 4.1 mΩ/25 μm.

Example 3

Example 1 is repeated but the aluminium chloride in the immersion bath is replaced by 15 g of sodium chloride and 10 ml of 25% strength acetic acid. This is followed by aftertreatment by rolling as specified in Example 1. The standardized specific surface resistance of the articles obtained is 2.8 mΩ/25 μm.

Example 4

A conductive gravure ink is prepared by stirring to give 16.8 parts by weight of a varnish (film extender 111350 PN for half-tone printing, A.M. Ramp & Co GmbH), 0.2 parts by weight of a dispersing additive (Byk 301, Byk-Chemie GmbH), 9.1 parts by weight of ethoxypropanol and 73.9 parts by weight of silver powder (7000-35, Ferro) and the ink is homogenized in a bead mill. The desired gravure-printing viscosity is set by addition of ethoxypropanol.

A gravure printing press (Moser) is used to print UHF test antennas with a thickness of 3.5 μm onto a PET film (HSPL 100, Coveme) which is 75 μm thick, with a speed of 50 m/min.

After these antennas have been dried their specific surface resistance is greater than 200 kΩ. Subsequently the printed specimens are immersed for 1 second in a solution of 10 g of sodium chloride in 200 ml of water that has been heated to 90° C. The specific surface resistance falls to 67 mΩ. Subsequent two-fold cold-rolling with a pressure of 30 bar (roll diameter 100 mm, web width 30 mm) reduces the specific surface resistance to 41 mΩ. Renewed immersion for one second in the NaCl solution identified above reduces the specific surface resistance further to 26 mΩ, corresponding to a standardized specific surface resistance of 3.6 mΩ/25 μm.

The invention claimed is:

1. A process for producing an article having on at least part of its surface an electrically conductive coating, which article is selected from the group consisting of a printed circuit board, RFID antenna, battery and solar cell, wherein the process consists of at least partly coating a substrate with a composition comprising finely divided electrically conductive silver particles and a binder and improving the electrical conductivity of the electrically conductive coating by subjecting the coated substrate to at least one treatment with a composition that consists of water and a halide ion source at a temperature in the range from 50 to 95° C., wherein the composition optionally comprises a water soluble organic or inorganic acid, wherein the halide ion source is selected from an alkali metal halide, an alkaline earth metal halide, an aluminium halide, a zinc halide, and an ammonium halide such that the standardized specific surface resistance of the coating is less than 10 mΩ/25 μm.

2. The process according to claim 1, wherein a chloride ion source is used as halide ion source.

3. The process according to claim 1, wherein the concentration of the halide ion source is 0.01 to 10% by weight, based on the amount of water.

4. The process according to claim 1, wherein the composition comprising finely divided electrically conductive silver particles and a binder comprises as its binder an organic polymeric binder or a curable component.

5. The process according to claim 4, wherein the binder is selected from polyvinyl butyrals and (meth)acrylate-based polymers.

6. The process according to claim 1, wherein the composition comprising finely divided electrically conductive silver particles and a binder is applied by screen printing, ink-jet printing or gravure printing to the substrate.

7. A process for producing an article having on at least part of its surface an electrically conductive coating, which article is selected from the group consisting of a printed circuit board, RFID antenna, battery and solar cell, wherein the process consists of at least partly coating a substrate with a composition comprising finely divided electrically conductive silver particles and a binder, improving the electrical conductivity of the electrically conductive coating by subjecting the coated substrate to at least one treatment with a composition that consists of water and a halide ion source at a temperature in the range from 50 to 95° C., and subjecting the article to at least one after treatment by rolling at a temperature of ≤200° C., wherein the composition optionally comprises a water soluble organic or inorganic acid, wherein the halide ion source is selected from an alkali metal halide, an alkaline earth metal halide, an aluminium halide, a zinc halide, and an ammonium halide such that the standardized specific surface resistance of the coating is less than 10 mΩ/25 μm.

8. The process according to claim 7, wherein the rolling is carried out at ambient temperature.

9. A process for producing an article having on at least part of its surface an electrically conductive coating, which article is selected from the group consisting of a printed circuit board, RFID antenna, battery and solar cell, wherein the process comprises at least partly coating a substrate with a composition comprising finely divided electrically conductive silver particles and a binder and improving the electrical conductivity of the electrically conductive coating by subjecting the coated substrate to at least one treatment with a composition that consists of water and a halide ion source at a temperature in the range from 50 to 95° C., wherein the composition optionally comprises a water soluble organic or inorganic acid, wherein the halide ion source is selected from an alkali metal halide, an alkaline earth metal halide, an aluminium halide, a zinc halide, and an ammonium halide such that the standardized specific surface resistance of the coating is less than 10 mΩ/25 μm, wherein the article is further subjected initially to a first rolling operation at ambient temperature and subsequently to at least one further rolling operation at a temperature in the range from 70 to 200° C.

10. A process for producing an article having on at least part of its surface an electrically conductive coating, which article is selected from the group consisting of a printed circuit board, RFID antenna, battery and solar cell, wherein the process comprises at least partly coating a substrate with a composition comprising finely divided electrically conductive silver particles and a binder and improving the electrical conductivity of the electrically conductive coating by subjecting the coated substrate to at least one treatment with a composition that consists of water and a halide ion source at a temperature in the range from 50 to 95° C., wherein the composition optionally comprises a water soluble organic or inorganic acid, wherein the halide ion source is selected from an alkali metal halide, an alkaline earth metal halide, an aluminium halide, a zinc halide, and an ammonium halide such that the standardized specific surface resistance of the coating is less than 10 mΩ/25 μm, wherein the article is additionally provided with a protective coat or topcoat.

11. A process for producing an article having on at least part of its surface an electrically conductive coating, which article is selected from the group consisting of a printed circuit board, RFID antenna, battery and solar cell, wherein the process comprises at least partly coating a substrate with a composition comprising finely divided electrically conductive silver particles and a binder and improving the electrical conductivity of the electrically conductive coating by subjecting the coated substrate to at least one treatment with a composition that consists of water and a halide ion source at a temperature in the range from 50 to 95° C., wherein the composition optionally comprises a water soluble organic or inorganic acid, wherein the halide ion source is selected from an alkali metal halide, an alkaline earth metal halide, an aluminium halide, a zinc halide, and an ammonium halide such that the standardized specific surface resistance of the coating is less than 10 mΩ/25 μm, wherein the article is submitted to at least one after treatment by rolling at a temperature of ≤200° C., wherein the article is additionally provided with a protective coat or topcoat.

* * * * *